US012640733B2

(12) United States Patent
Rosa et al.

(10) Patent No.: US 12,640,733 B2
(45) Date of Patent: May 26, 2026

(54) HIGH-SIDE GATE DRIVERS FOR FIXED VOLTAGE RAILS

(71) Applicant: Allegro MicroSystems, LLC, Manchester, NH (US)

(72) Inventors: Tommaso Rosa, Milan (IT); Guillaume Aulagnier, Cannes (FR)

(73) Assignee: Allegro MicroSystems, LLC, Manchester, NH (US)

( * ) Notice: Subject to any disclaimer, the term of this patent is extended or adjusted under 35 U.S.C. 154(b) by 36 days.

(21) Appl. No.: 18/928,600

(22) Filed: Oct. 28, 2024

(65) Prior Publication Data

US 2026/0121634 A1 Apr. 30, 2026

(51) Int. Cl.
H02M 1/08 (2006.01)
H03K 17/687 (2006.01)

(52) U.S. Cl.
CPC ............ *H03K 17/687* (2013.01); *H02M 1/08* (2013.01); *H03K 2217/0063* (2013.01)

(58) Field of Classification Search
CPC .................. H02M 1/08; H03K 17/687; H03K 2217/0063
USPC .......................................... 327/108, 109, 110
See application file for complete search history.

(56) References Cited

U.S. PATENT DOCUMENTS

| | | | |
|---|---|---|---|
| 4,461,966 A | 7/1984 | Hebenstreit | |
| 4,748,351 A | 5/1988 | Barzegar | |
| 4,970,420 A | 11/1990 | Billings | |

| | | | |
|---|---|---|---|
| 5,019,719 A | 5/1991 | King | |
| 5,051,609 A | 9/1991 | Smith | |
| 5,430,613 A | 7/1995 | Hastings et al. | |
| 5,598,135 A | 1/1997 | Maeda et al. | |
| 5,847,631 A | 12/1998 | Taylor et al. | |
| 5,959,846 A | 9/1999 | Noguchi et al. | |
| 6,107,860 A | 8/2000 | Vinciarelli | |
| 6,181,130 B1 | 1/2001 | Hoshi et al. | |
| 6,281,560 B1 | 8/2001 | Allen et al. | |
| 6,377,155 B1 | 4/2002 | Allen et al. | |

(Continued)

FOREIGN PATENT DOCUMENTS

| | | |
|---|---|---|
| DE | 3700488 A1 | 7/1988 |
| DE | 10 2004 033 125 A1 | 2/2006 |

(Continued)

OTHER PUBLICATIONS

U.S. Appl. No. 18/192,932, filed Mar. 30, 2023, Horan et al.

(Continued)

*Primary Examiner* — William Hernandez
(74) *Attorney, Agent, or Firm* — DALY, CROWLEY, MOFFORD & DURKEE, LLP

(57) ABSTRACT

Systems, structures, packages, circuits, and methods provide high-side gate driver circuits configured to control operation of high-side power (switching) transistors without use of external bootstrap capacitors. A high-side driver can include three sections, including a pull-up section, first pull-down section, and a second pull-down or Miller clamp section. The gate drivers can include a charge pump circuit and can avoid use of bootstrap capacitors and related circuitry. Partitioned gate drivers can include an individual pull-up section, an individual first pull-down section, and an individual second pull-down section for each of multiple high-side power transistors.

15 Claims, 7 Drawing Sheets

(56) References Cited

U.S. PATENT DOCUMENTS

| 6,775,901 | B1 | 8/2004 | Lee et al. |
|---|---|---|---|
| 6,791,851 | B2 | 9/2004 | Brkovic |
| 7,023,315 | B2 | 4/2006 | Yeo et al. |
| 7,119,448 | B1 | 10/2006 | de Stasi |
| 7,173,835 | B1 | 2/2007 | Yang |
| 7,663,351 | B2 | 2/2010 | Korsunsky |
| 7,719,112 | B2 | 5/2010 | Shen |
| 7,804,697 | B2 | 9/2010 | Melanson |
| 7,868,431 | B2 | 1/2011 | Feng et al. |
| 8,063,689 | B2 | 11/2011 | Theiler |
| 8,094,458 | B2 | 1/2012 | Furnival |
| 8,217,748 | B2 | 7/2012 | Feng et al. |
| 8,680,837 | B2 | 3/2014 | Zeng et al. |
| 8,736,343 | B2 | 5/2014 | Chen et al. |
| 8,816,666 | B2 | 8/2014 | Kimura et al. |
| 9,048,020 | B2 | 6/2015 | Calvillo Cortes et al. |
| 9,660,584 | B2 | 5/2017 | Modi et al. |
| 9,743,523 | B2 | 8/2017 | Huang et al. |
| 9,847,166 | B2 | 12/2017 | Kneller |
| 9,887,034 | B2 | 2/2018 | Francis |
| 9,899,140 | B2 | 2/2018 | Kneller et al. |
| 9,922,764 | B2 | 3/2018 | Kneller et al. |
| 9,948,294 | B2 | 4/2018 | Peter et al. |
| 10,002,703 | B2 | 6/2018 | Wang et al. |
| 10,014,798 | B1 | 7/2018 | Vinciarelli |
| 10,062,495 | B2 | 8/2018 | Lloyd |
| 10,176,917 | B2 | 1/2019 | Parish et al. |
| 10,217,558 | B2 | 2/2019 | Kneller |
| 10,224,143 | B2 | 3/2019 | Kneller et al. |
| 10,229,779 | B2 | 3/2019 | Harber |
| 10,234,513 | B2 | 3/2019 | Vig et al. |
| 10,256,027 | B2 | 4/2019 | Li et al. |
| 10,319,509 | B2 | 6/2019 | Kneller et al. |
| 10,347,413 | B2 | 7/2019 | Francis |
| 10,573,457 | B2 | 2/2020 | Wang et al. |
| 10,811,181 | B2 | 10/2020 | Parish et al. |
| 10,930,422 | B2 | 2/2021 | Francis |
| 11,139,102 | B2 | 10/2021 | Kneller et al. |
| 11,201,619 | B2 | 12/2021 | Rinne et al. |
| 11,211,929 | B2 | 12/2021 | Rinne et al. |
| 11,282,631 | B2 | 3/2022 | Francis |
| 11,764,778 | B2 | 9/2023 | Rinne et al. |
| 12,160,232 | B2 | 12/2024 | Rinne et al. |
| 2009/0147544 | A1 | 6/2009 | Melanson |
| 2009/0237899 | A1 | 9/2009 | Furnival |
| 2012/0008344 | A1 | 1/2012 | Zeng et al. |
| 2012/0206171 | A1 | 8/2012 | Kimura et al. |
| 2013/0293268 | A1 | 11/2013 | Draxelmayr et al. |
| 2016/0181004 | A1 | 6/2016 | Li et al. |
| 2018/0115311 | A1* | 4/2018 | Norling ............ H03K 5/08 |
| 2020/0044635 | A1* | 2/2020 | Ju ............ H03K 4/48 |
| 2021/0376822 | A1 | 12/2021 | Thompson et al. |
| 2025/0211226 | A1* | 6/2025 | Udrea ............ H03K 17/0822 |

FOREIGN PATENT DOCUMENTS

| GB | 2 250 383 A | 6/1992 |
|---|---|---|
| GB | 2 341 288 A | 3/2000 |
| JP | H01300617 A | 12/1989 |
| JP | 2001 167941 A | 6/2001 |
| JP | 2003 234234 A | 8/2003 |
| JP | 2008 072021 A | 3/2008 |
| WO | WO 93/21690 | 10/1993 |
| WO | WO 95/12247 | 5/1995 |
| WO | WO 2009/008739 A1 | 1/2009 |
| WO | WO 2010/061281 A2 | 6/2010 |
| WO | WO 2011/137845 A1 | 11/2011 |
| WO | WO 2021/211920 A1 | 10/2021 |

OTHER PUBLICATIONS

U.S. Appl. No. 18/297,034, filed Apr. 7, 2023, Torti.
U.S. Appl. No. 18/300,708, filed Apr. 14, 2023, Mangtani et al.
U.S. Appl. No. 18/300,711, filed Apr. 14, 2023, Taylor et al.
U.S. Appl. No. 18/302,998, filed Apr. 19, 2023, Salato et al.
U.S. Appl. No. 18/303,740, filed Apr. 20, 2023, Horan et al.
U.S. Appl. No. 18/307,921, filed Apr. 27, 2023, Salato et al.
U.S. Appl. No. 18/321,859, filed May 23, 2023, Horan et al.
U.S. Appl. No. 18/327,292, filed Jun. 1, 2023, Horan et al.
U.S. Appl. No. 18/338,479, filed Jun. 21, 2023, Taylor.
U.S. Appl. No. 18/340,053, filed Jun. 23, 2023, Salato et al.
U.S. Appl. No. 18/349,266, filed Jul. 10, 2023, Mangtani et al.
U.S. Appl. No. 18/350,049, filed Jul. 11, 2023, Taylor.
U.S. Appl. No. 18/456,666, filed Aug. 28, 2023, David et al.
U.S. Appl. No. 18/471,443, filed Sep. 21, 2023, Salato et al.
U.S. Appl. No. 18/477,755, filed Sep. 29, 2023, Thompson.
U.S. Appl. No. 18/495,060, filed Oct. 26, 2023, Mangtani et al.
U.S. Appl. No. 18/519,254, filed Nov. 27, 2023, Chandra et al.
U.S. Appl. No. 18/524,130, filed Nov. 30, 2023, Chandra et al.
U.S. Appl. No. 18/524,132, filed Nov. 30, 2023, Chandra et al.
U.S. Appl. No. 18/533,527, filed Dec. 8, 2023, David et al.
U.S. Appl. No. 18/537,906, filed Dec. 13, 2023, Mangtani et al.
U.S. Appl. No. 18/538,520, filed Dec. 13, 2023, Chandra et al.
U.S. Appl. No. 18/417,582, filed Jan. 19, 2024, Taylor.
U.S. Appl. No. 18/430,841, filed Feb. 2, 2024, Thompson et al.
U.S. Appl. No. 18/438,831, filed Feb. 12, 2024, David et al.
U.S. Appl. No. 18/443,469, filed Feb. 16, 2024, David et al.
U.S. Appl. No. 18/594,168, filed Mar. 4, 2024, Thompson et al.
U.S. Appl. No. 18/606,252, filed Mar. 15, 2024, Mangtani et al.
U.S. Appl. No. 18/633,685, filed Apr. 12, 2024, Balakrishnan et al.
U.S. Appl. No. 18/779,495, filed Jul. 22, 2024, David et al.
U.S. Appl. No. 18/813,518, filed Aug. 23, 2024, Mangtani et al.
U.S. Appl. No. 18/818,749, filed Aug. 29, 2024, Latham et al.
Bourgeois, "An Isolated Gate 25 Drive For Power MOSFETs and IGBTs", STMicroelectronics Group, AN461/0194, 1999; 7 pages.
"ADuM4135 Data Sheet, Single- /Dual-Supply, High Voltage Isolated IGBT Gate Driver with Miller Clamp", Analog Devices Inc., Rev. E, 2015; 17 pages.
"Si827x", Datasheet Rev. 0.5, Silicon Laboratories Inc., 2016; 43 pages.

* cited by examiner

700 —

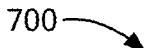

With an input, receiving command signal pulses for operation of the one or more HS power transistors

702

↓

With one or more charge pump circuits, storing charge for operation of the one or more HS power transistors, respectively

704

↓

With one or more pull-up sections configured to pull up a gate voltage on the one or more HS power transistors, respectively, turning the one or more HS power transistors on according to the command signals, wherein the one or more pull-up sections are configured to rectify the command signal pulses and receive charge from the one or more charge pump circuits and provide power to the one or more HS power transistors

706

↓

With one or more first pull-down sections configured to provide an initial current to initiate turning off the one or more HS power transistors, respectively, providing the initial current to place the one or more HS power transistors in an off state according to the command signal pulses

708

↓

With one or more second pull-down sections including a Miller clamp circuit, maintaining the one or more HS power transistors in the off state, respectively, according to the command signal pulses

710

↓

Wherein the one or more HS power transistors comprise one or more NMOS transistors

HIGH-SIDE GATE DRIVERS FOR FIXED VOLTAGE RAILS

BACKGROUND

Solid state switches typically include a transistor structure. The controlling electrode of the switch, usually referred to as its gate (or base), is typically controlled (driven) by a switch drive circuit, sometimes also referred to as gate drive circuit or a gate driver. Such solid state switches are typically voltage-controlled, turning on when the gate voltage exceeds a manufacturer-specific threshold voltage by a margin, and turning off when the gate voltage remains below the threshold voltage by a margin.

Switch drive circuits typically receive their control instructions from a controller such as a pulse-width-modulated (PWM) controller via one or more switch driver inputs. Switch drive circuits deliver their drive signals directly (or indirectly via networks of active and passive components) to the respective terminals of the switch (gate and source).

Some electronic systems, including ones with solid state switches, have employed galvanic isolation to separate voltage potentials. Such galvanic isolation can be used to separate circuits in order to protect users from coming into direct contact with hazardous voltages.

Various transmission techniques are available for signals to be sent across galvanic isolation barriers including optical, capacitive, and magnetic coupling techniques. Magnetic coupling typically relies on use of a transformer to magnetically couple circuits on the different sides of the transformer, typically referred to as the primary and secondary sides, while also providing galvanic separation of the circuits.

In some gate driver applications, so-called NMOS devices—referring to metal oxide semiconductor (MOS) devices having an n-doped channel (as opposed to a p-doped channel)—are often used as a semiconductor switch. NMOS devices offer certain benefits, compared to MOS devices having a p-doped channel (PMOS), including lower power consumption and higher speed of operation.

Many semiconductor switches using NMOS devices as high-side switches (where "high-side" refers to the device being placed between the positive power line and the load in the circuit) employ a bootstrap capacitor to derive the driving voltage necessary to turn on the NMOS devices. The bootstrap capacitor accomplishes this by storing and releasing charge to drive the gate of high-side device(s). This solution can work satisfactorily for many applications but requires an extra external coupling connection (pin) and external capacitor.

SUMMARY

Aspects of the present disclosure are directed to high-side gate drivers utilizing fixed voltage rails where bootstrap capacitors are not employed.

One general aspect of the present disclosure includes a gate driver configured to drive a high-side power transistor without an external bootstrap capacitor. The gate driver can include: an input configured to receive a command signal pulses for operation of the high-side power transistor; a charge pump circuit configured as a high-voltage supply rail; a pull-up section configured to pull up a gate voltage on the high-side power transistor to turn the high-side power transistor on according to the command signal pulses, where the pull-up section is connected to the high-voltage supply rail, and where the pull-up section is configured to rectify the command signal pulses and provide power to the high-side power transistor; a first pull-down section configured to provide an initial current to initiate turning off the high-side power transistor to place the high-side power transistor in an off state according to the command signal pulses; and a second pull-down section including a Miller clamp circuit configured to maintain an off state of the high-side power transistor according to the command signal pulses.

Implementations may include one or more of the following features. The high-side power transistor may include an NMOS transistor. The pull-up section may include a first current source (E0) and a first switch (M0); where the first pull-down section may include a second current source (E1) and a second switch (M1); and where the second pull-down section may include a charge pump input configured to receive charge from the charge pump circuit, where the second pull-down section may include a control node (A) connected to the first and second current sources, where the second pull-down section may include a third switch (M2) connected to the control node, where the second pull-down section may include a Zener diode connected to the third switch (M2) and configured to limit a maximum $V_{GS}$ voltage of the high-side power transistor during a turn-on phase, and where the third switch may be configured as a Miller clamp for the high-side power transistor; where the first current source (E0) and second current source (E1) may be configured to control operation of the Miller clamp; and where the first and second switches (M0, M1) may be configured to control a gate-source voltage ($V_{GS}$) of the high-side power transistor. The pull-up section may include a level shifter and a power rail receiving charge from the charge pump circuit. The first and second current sources (E0 and E1) may be configured to control the Miller clamp (M2), and where the first and second switches (M0, M1) may be configured to control the gate-source voltage ($V_{GS}$) of the high-side power transistor. The gate driver may include third and fourth switches configured in parallel with E0 and E1, respectively, to provide a current pulse when the first current source (E0) or second current source (E1) is turned on, respectively, to facilitate an initial transient of the control node (A).

Another general aspect of the present disclosure includes a partitioned gate driver configured to drive a plurality of high-side power transistors without an external bootstrap capacitor. The partitioned gate driver can include: an input configured to receive a command signal pulses for operation of the plurality of high-side power transistors; a charge pump circuit configured as a high-voltage supply rail; a plurality of pull-up sections configured to receive charge from the high-voltage supply rail, each configured to pull up a gate voltage on a high-side power transistor, respectively, to turn the high-side power transistor on according to the command signal pulses, where the pull-up section is configured to rectify the command signal pulses and provide power to the high-side power transistor; a plurality of first pull-down sections, each configured to provide an initial current to initiate turning off the high-side power transistor, respectively, to place the high-side power transistor in an off state according to the command signal pulses; and a plurality of second pull-down sections, each including a Miller clamp circuit configured to maintain the off state of the high-side power transistor, respectively, according to the command signal pulses.

Implementations may include one or more of the following features. The plurality of high-side power transistors may include NMOS transistors. Each pull-up section may include a first current source (E0) and a first switch (M0);

where each first pull-down section may include a second current source (E1) and a second switch (M1); and where each second pull-down section may include a charge pump input configured to receive charge from a charge pump, where the second pull-down section may include a control node (A) connected to the first and second current sources, a third switch (M2) connected to the control node, a Zener diode connected to the third switch (m2) and configured to limit a maximum $V_{GS}$ voltage of a respective high-side power transistor during a turn-on phase, and is configured as a Miller clamp for the respective high-side power transistor; where the first current source (E0) and second current source (E1) are configured to control operation of the Miller clamp; and where the first and second switches (M0, M1) are configured to control a gate-source voltage ($V_{GS}$) of the respective high-side power transistor. The pull-up section may include a level shifter and a power rail receiving charge from the charge pump. The first and second current sources (E0, E1) may be configured to control the Miller clamp (M2), and where the first and second switches (M0, M1) may be configured to control the gate-source voltage ($V_{GS}$) of the respective high-side power transistor. The partitioned gate driver may include third and fourth switches configured in parallel with the first and second current sources (E0 and E1), respectively, and configured to provide a current pulse when the first current source (E0) or second current source (E1) is turned on, respectively, to facilitate an initial transient of the control node (A).

A further general aspect of the present disclosure includes a method of driving one or more high-side power transistors without using an external bootstrap capacitor. The method can include: with an input, receiving command signal pulses for operation of the one or more high-side power transistors; with one or more pull-up sections configured to pull up a gate voltage on the one or more high-side power transistors, respectively, turning the one or more high-side power transistors on according to the command signal pulses, where the one or more pull-up sections are configured to rectify the command signal pulses and provide power to the one or more high-side power transistors; with one or more first pull-down sections configured to provide an initial current to initiate turning off the one or more high-side power transistors, respectively, providing an initial current to place the one or more high-side power transistors in an off state according to the command signal pulses; and with one or more second pull down sections including a Miller clamp circuit, maintaining the one or more high-side power transistors in the off state, respectively, according to the command signal pulses.

Implementations may include one or more of the following features. The one or more high-side power transistors may include an NMOS transistor. Each pull-up section may include a first current source (E0) and a first switch (M0); where each first pull-down section may include a second current source (E1) and a second switch (M1); and where each second pull-down section may include a charge pump input configured to receive charge from a charge pump circuit, where the second pull-down section may include a control node (A) connected to the first and second current sources, where the second pull-down section may include a third switch (M2) connected to the control node, where the second pull-down stage may include a Zener diode connected to the third switch (M2) and configured to limit a maximum $V_{GS}$ voltage of a respective high-side power transistor during a turn-on phase, and where the third switch may be configured as a Miller clamp for the respective high-side power transistor; where the first current source (E0) and second current source (E1) may be configured to control operation of the Miller clamp; and where the first and second switches (M0, M1) may be configured to control a gate-source voltage ($V_{GS}$) of the respective high-side power transistor. Each pull-up section may include a level shifter and a power rail receiving charge from the charge pump circuit. The first and second current sources (E0 and E1) may be configured to control the Miller clamp (M2), and where the first and second switches (M0, M1) may be configured to control the gate-source voltage ($V_{GS}$) of the respective high-side power transistor. The method may include providing third and fourth switches configured in parallel with the first and second current sources (E0, E1) configured to provide a current pulse when the first current source (E0) and/or second current source (E1) is turned on, respectively, to facilitate an initial transient of the control node (A).

Other embodiments of these described aspects can include corresponding computer systems, apparatus, and computer programs recorded on one or more computer storage devices, each configured to perform the actions of the described operations (functioning) and/or methods. Moreover, implementations of the described techniques/technology may include hardware, a method or process, or computer software on a computer-accessible medium.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the present disclosure, which is susceptible of many embodiments. What follows is illustrative, but not exhaustive, of the scope of the present disclosure.

BRIEF DESCRIPTION OF THE DRAWINGS

The manner and process of making and using the disclosed embodiments may be appreciated by reference to the figures of the accompanying drawings. In the figures like reference characters refer to like components, parts, elements, or steps/actions; however, similar components, parts, elements, and steps/actions may be referenced by different reference characters in different figures. It should be appreciated that the components and structures illustrated in the figures are not necessarily to scale, emphasis instead being placed upon illustrating the principals of the concepts described herein. Furthermore, embodiments are illustrated by way of example and not limitation in the figures, in which:

FIG. 7 is a diagram showing an example method of operating a high-side gate driver for controlling one or more high-side transistors in accordance with the present disclosure.

DETAILED DESCRIPTION

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The subject technology is susceptible of many embodiments. What follows is illustrative, but not exhaustive, of the scope of the subject technology.

Aspects, examples, and embodiments of the present disclosure are directed to and include high-side (HS) gate driver circuits (a.k.a., drivers or "pull-up" drivers) configured to control operation of high-side power (switching) transistors.

Such assemblies, structures, and packages can be used for systems, structures, and circuits for galvanic isolation (a.k.a., voltage isolation), e.g., for high-voltage applications. In some embodiments, a transformer with a core may have, e.g., a step up, a step down, or a power transformer configuration. In some embodiments, a transformer may have multiple input and/or output coils/coil structures.

The galvanically isolated gate drivers can be configured to drive an external gate on a solid-state (semiconductor) switch, e.g., a field effect transistor (FET), a metal oxide semiconductor FET (MOSFET), a metal semiconductor FET (MESFET), a gallium nitride FET (GaN FET), a high electron mobility transistor (HEMT), a silicon carbide FET (SiC FET), an insulated gate bipolar transistor (IGBT), or another load.

Figure 1:
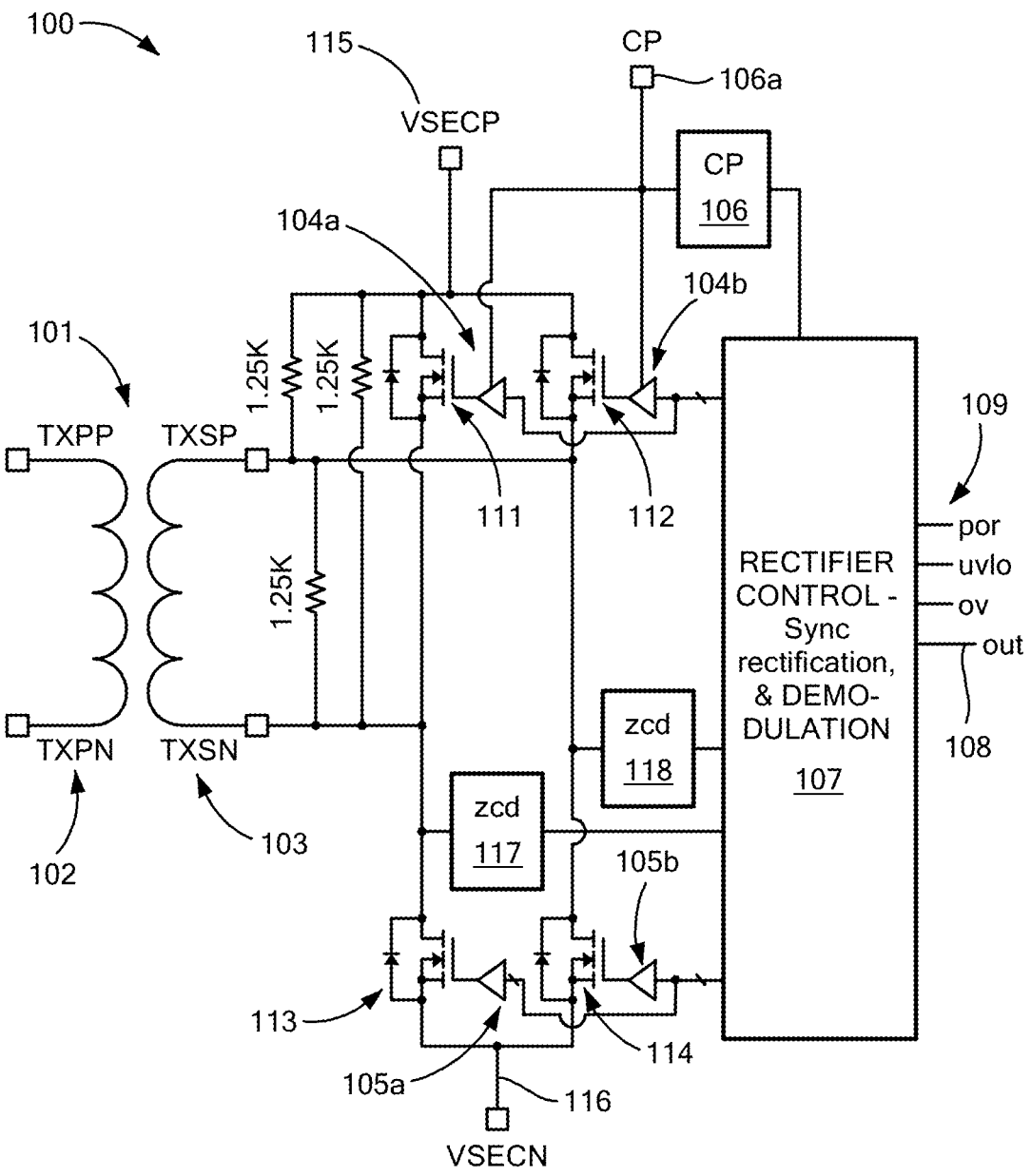
FIG. 1 is circuit diagram of an example galvanically isolated gate driver application in accordance with the present disclosure.

FIG. 1 is circuit diagram of an example galvanically isolated gate driver application 100 in accordance with the present disclosure. Driver 100 includes a transformer 101 having a primary side 102 and a secondary side 103. Driver 100 further includes rectification devices 104a-b for high-side power rail 115. Driver may also include rectification devices 105a-b for low-side power rail 116. Four power (switching) transistors 111-114 are also included. Driver 100 can include a controller 107, e.g., configured to control rectification and demodulation, etc. Controller 107 can provide an output control signal 108 and may provide and/or receive additional output signals and/or input signals 109a-c, e.g., power on reset (POR), undervoltage lockout (UVLO), overvoltage (OV), etc. Zero crossing devices (ZCD) 118-119 may also be present, as shown.

In some embodiments, the rectification devices 104a-b and 105a-b may be N-DMOS power devices (N-channel enhancement type devices are indicated). The high-side drivers (also called HS drivers) use a high-voltage rail 106a presented by internal charge-pump circuit 106 to drive the high-side power transistors 111-112. In some embodiments, galvanically isolated gate driver circuit 100 can be integrated inside a power module containing the primary side and secondary side of the transformer.

Figure 2:
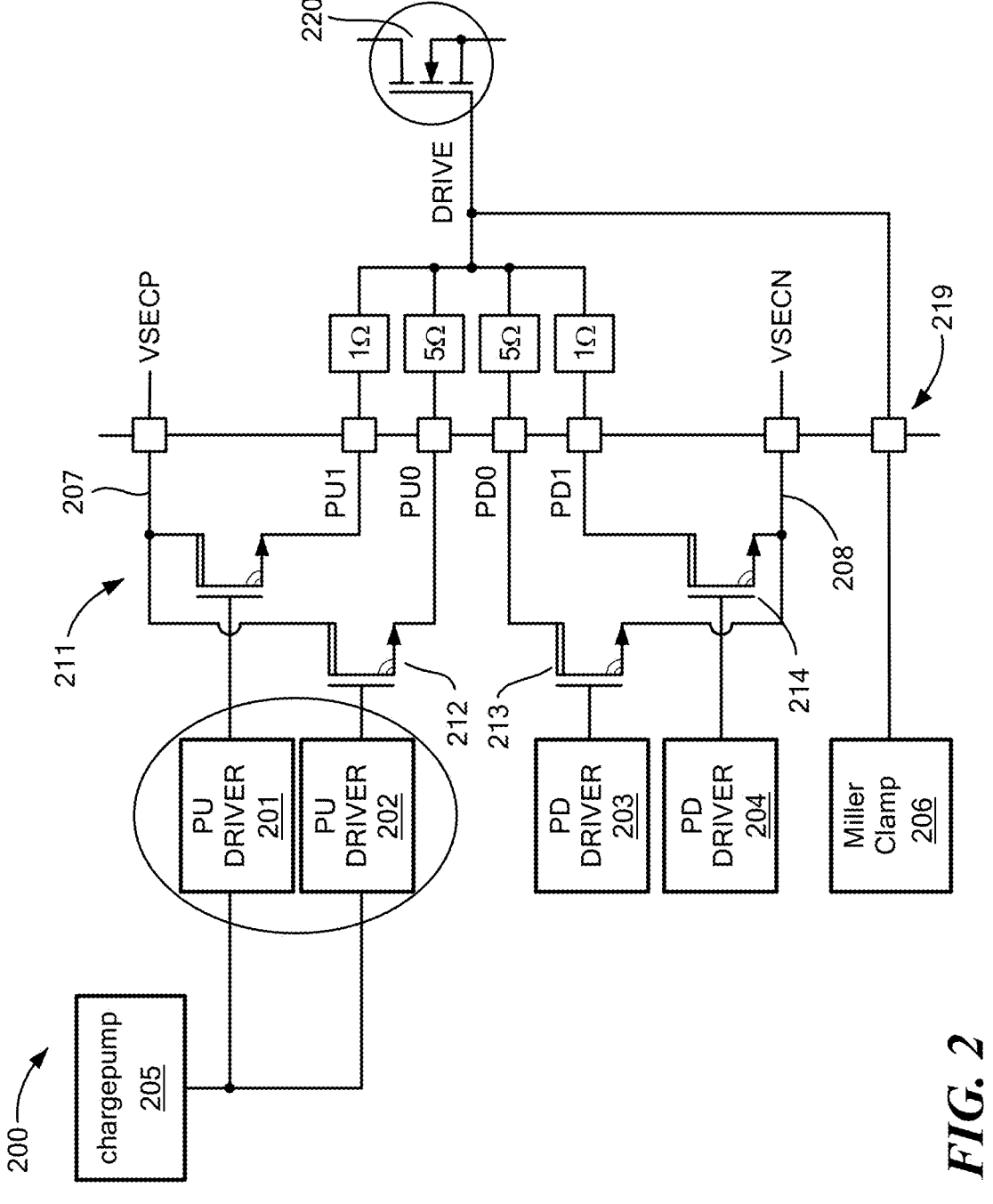
FIG. 2 is circuit diagram of another example galvanically isolated gate driver application in accordance with the present disclosure.

FIG. 2 is circuit diagram of another example galvanically isolated gate driver application 200 in accordance with the present disclosure.

Driver circuit 200 includes pull-up drivers 201-202 and pull-down drivers 203-204 for controlling power (switching) transistor 211-214, respectively. Transistors 211-212 are shown on the high side while transistor 213-214 are shown on the low side of driver circuit 200. In addition to pull-up drivers 201-202, the high side includes a charge pump 205 and high-side power rail 207. The low side includes, in addition to the pull-down drivers 203-204, a Miller clamp circuit 206 and a low-side power rail 208. In operation, driver circuit 200 can control operation of power device 220, e.g., a SiC MOSFET or GaN FET.

In some embodiments, galvanically isolated gate driver circuit 200 can be integrated inside a power module containing the primary side and secondary side of the transformer. For example, in some embodiments, driver circuit 200 may be included in a chip package, as indicated by package boundary 219.

Figure 3:
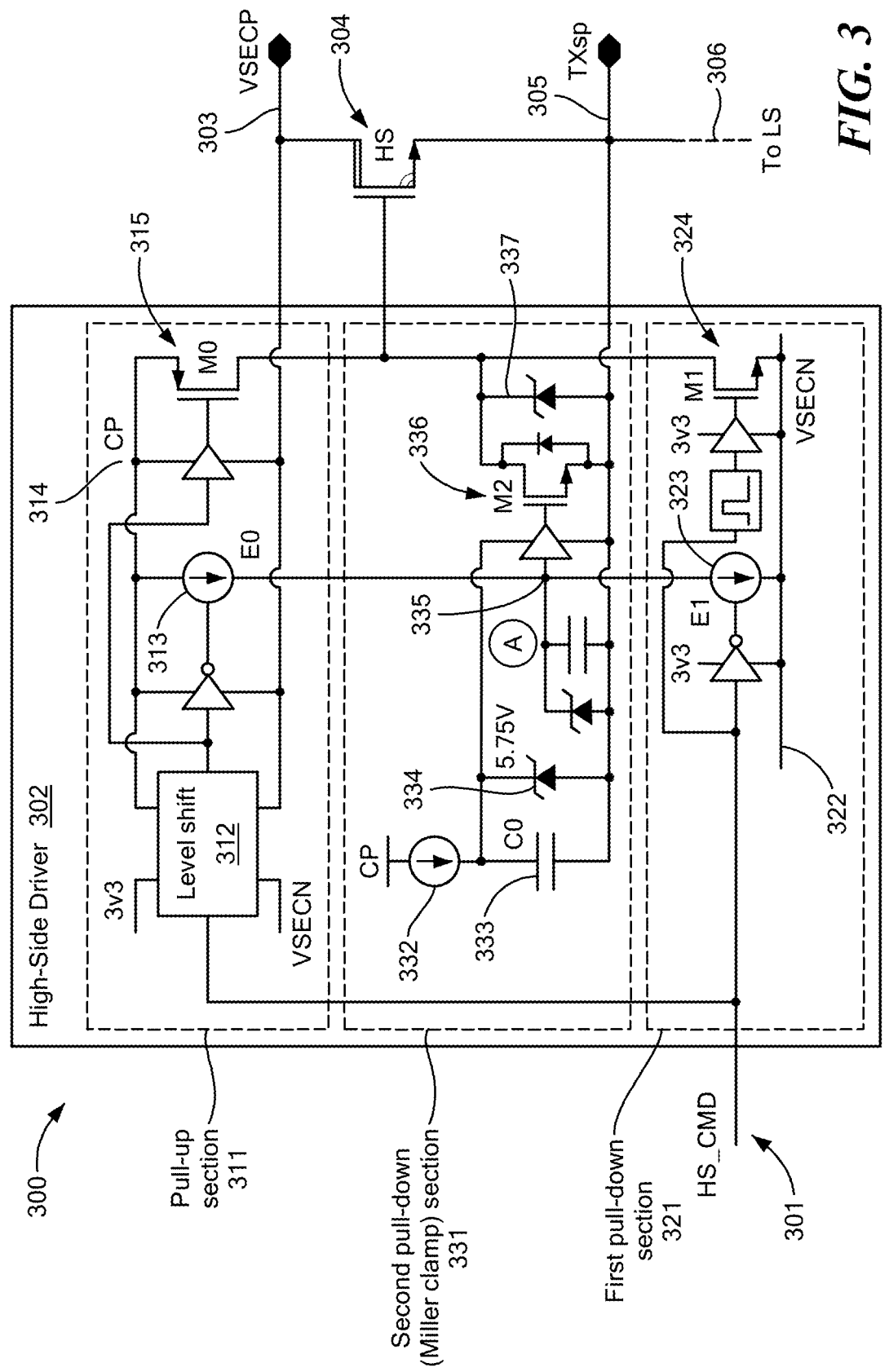
FIG. 3 is circuit diagram showing basic structure of an example high-side gate driver in accordance with the present disclosure.

FIG. 3 is circuit diagram showing basic structure of an example high-side (HS) gate driver 300 in accordance with the present disclosure. The driver 300 is configured to control operation of high-side power (switching) transistor 304 and can be subdivided into three sections (a.k.a., stages): a pull-up section 311; a first pull-down section 321; and a second pull-down section, a.k.a., a Miller clamp section 331.

Pull-up section 311 is configured to receive command signals (e.g., PWM signals) from input 301 and includes level shifter 312, first current source (E0) 313, high-voltage (HV) power rail 314, and first switch (M0) 315. HV power rail 314 can be configured as a floating current supply and can be included in a charge pump circuit, which may include an external charge pump capacitor (not shown).

First pull-down section 321 is configured to receive command signals (e.g., PWM signals) from input 301 and includes a connection to low voltage (LV) power rail 322, second current source (E1) 323, and second switch (M1) 324.

Second pull-down section (a.k.a., Miller clamp section) 331 includes a charge pump (CP) connection, through current (generator) source 332 (which is connected to HV rail 314 of the charge pump circuit), capacitor (C0) 333, first Zener diode 334, control node (A) 335, third switch (M2) 336, and second Zener diode 337. The second Zener diode 337 is configured to limit the maximum gate-source voltage ($V_{GS}$) voltage of the HS power during the turn-on phase and, thus, prevent overvoltage damage to power transistor 304.

In operation of driver 300, in response to command signals received at input 301, pull-up section 311 operates to turn on the high-side power transistor 304 while first pull down section 321 operates to turn off transistor 304. The second pull-down section 331 keeps the power securely turned off even in the presence of ringing or noise on the source of the high-side power transistor (e.g., NMOS switch). The first and second current sources (E0 and E1)—of the pull-up section 311 and first pull-down section 321, respectively—control the Miller clamp switch (M2) of the second pull-down section 331, while first and second switches (M0 and M1) control the $V_{GS}$ voltage of the high-side power transistor 304. Positive secondary supply decoupling pin access is shown at 303 while transformer secondary positive pin access is shown at 305.

In some embodiments, high-side gate driver 300 can be configured as pull-up driver in a gate driver application, e.g., as shown in FIGS. 1-2. As noted previously, each of galvanically isolated gate driver circuits 100-200 shown in FIGS. 1-2 can be integrated inside a power module (e.g., used for an EV) containing the primary side and secondary side of the transformer. For this reason, the number of available pins may be limited. In both cases, the use of a conventional bootstrap solution (as described above for the prior art) would require two dedicated pins. In contrast, driver circuit 300 would only require one (for the external charge-pump capacitor). In the case of the output pull-up driver, driver circuit 300 can also natively enable 100% duty cycle driving.

In some embodiments, the gate signal of first switch (M0) 315 can be read when first switch (M0) 315 is turning off and level-shifted (e.g., using a basic pulse shifter) to the LV domain, to be used to turn on second switch (M1) 314 (rather than relying on delays). In some embodiments, switches can be placed in parallel to first and second current sources 313, 323 (E0, E1), and can provide a large but brief current pulse when current source (E0) 313 or current source (E1) 323 is turned on, thus speeding up the initial transient of the control node "A" without significant impact on current consumption from the HV (CP) rail 314.

Driver circuit 300 can provide numerous advantages relative to prior art drivers. For example, embodiments may use just a single level-shifter. The floating supply of the HV (CP) rail 314 is only used to turn on the Miller clamp switch (M2) once the high-side (HS) power is already turned off. As a result, the amount of current that the floating supply has to provide to turn M2 on is greatly reduced, which means that smaller capacitance values can be used for capacitor ($C_0$) 333, e.g., capacitor values on the order of ~15 pF were successfully used for an implemented embodiment. Additionally, the timing of the circuit 300 can be accurately controlled to avoid any cross-conduction and to optimize the turn-on and turn-off times for the high-side power (switching) transistor 304.

Figure 4:
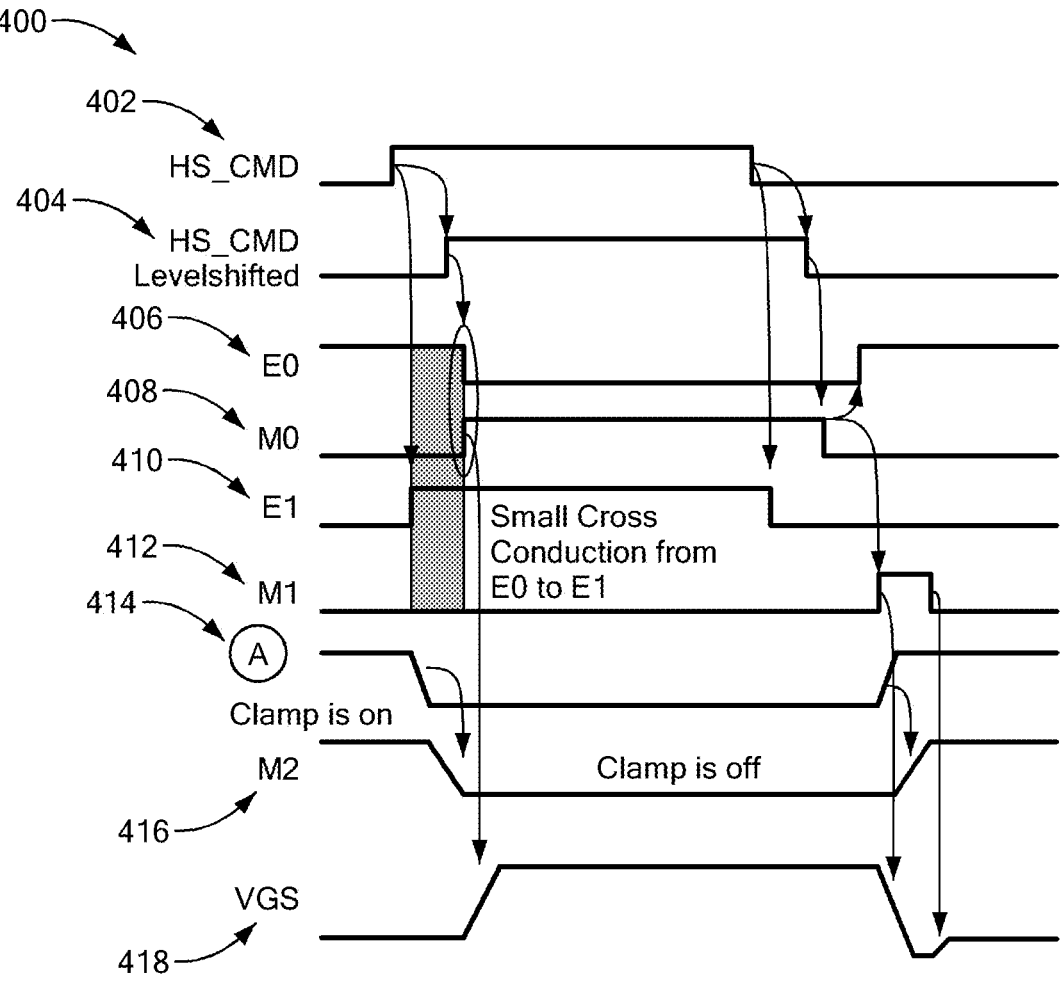
FIG. 4 is an example timing diagram, including simplified turn-on and turn-off signals, of the gate driver of FIG. 3.

FIG. 4 is an example timing diagram 400, including simplified turn-on and turn-off signals, of the gate driver of FIG. 3. The operational flow shown moves from left to right and top to bottom. A high-side command (HS_CMD) line 402 is shown receiving a command pulse. A level-shifted version of the high-side command (HS_CMD) line 402 is shown at 404. The state of E0 is shown at 406. The state of M0 is shown at 408. The state of E1 is shown at 410. The state of M1 is shown at 412. The state of A0 is shown at 414. The state of M2 is shown at 416. The state of $V_{GS}$ (of power transistor 304) is shown at 418.

Figure 5:
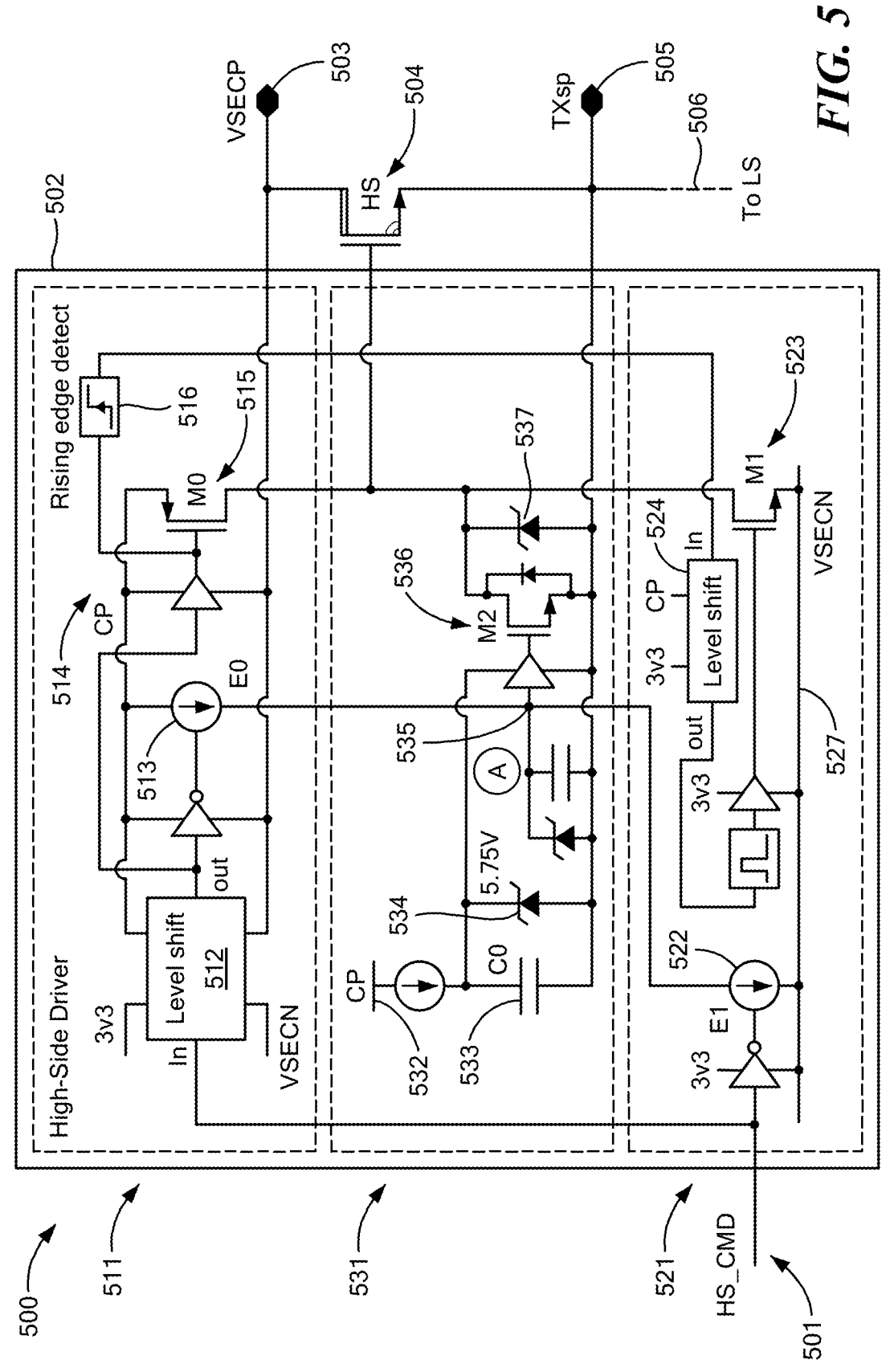
FIG. 5 is circuit diagram showing basic structure of an alternate example high-side gate driver in accordance with the present disclosure.

FIG. 5 is circuit diagram showing basic structure of an alternate example high-side gate driver 500 in accordance with the present disclosure. Similar to driver 300 of FIG. 3, driver 500 includes a pull-up section 511; a first pull-down section 521; and a second pull-down section, a.k.a., a Miller clamp section 531. Driver 500 also includes a rising edge detector 516, which can allow driver 500 to use the rising edge of the gate of the switch (M0) 515 of the pull-up section 511 to time the turning on of the switch (M1) 523 of the first pull-down section 521, e.g., for improved timing in controlling operation of the related high-side power transistor 504.

Pull-up section 511 is configured to receive command signals (e.g., PWM signals) from input 501 and includes level shifter 512, first current source (E0) 513, high-voltage (HV) power rail 514, and first switch (M0) 515. HV power rail 514 can be configured as a floating current supply and can be included in a charge pump circuit, which may include an external charge pump capacitor (not shown). Positive secondary supply decoupling pin access is shown at 503 while transformer secondary positive pin access is shown at 505. Pull-up section 511 also includes rising edge detector 516, noted above.

First pull-down section 521 is configured to receive command signals (e.g., PWM signals) from input 501 and includes second current source (E1) 523, second switch (M1) 524, and a connection to negative secondary supply decoupling rail 527.

Second pull-down section (a.k.a., Miller clamp section) 531 includes a charge pump (CP) connection, through current (generator) source 532 (which is connected to HV rail 514 of the charge pump circuit), capacitor (C0) 533, first Zener diode 534, control node (A) 535, third switch (a.k.a., Miller clamp switch) (M2) 536, and second Zener diode 537. Zener diode 537 is configured to limit the maximum gate-source voltage ($V_{GS}$) voltage of the HS power during the turn-on phase and, thus, prevent overvoltage damage to power transistor 504.

Figure 6:
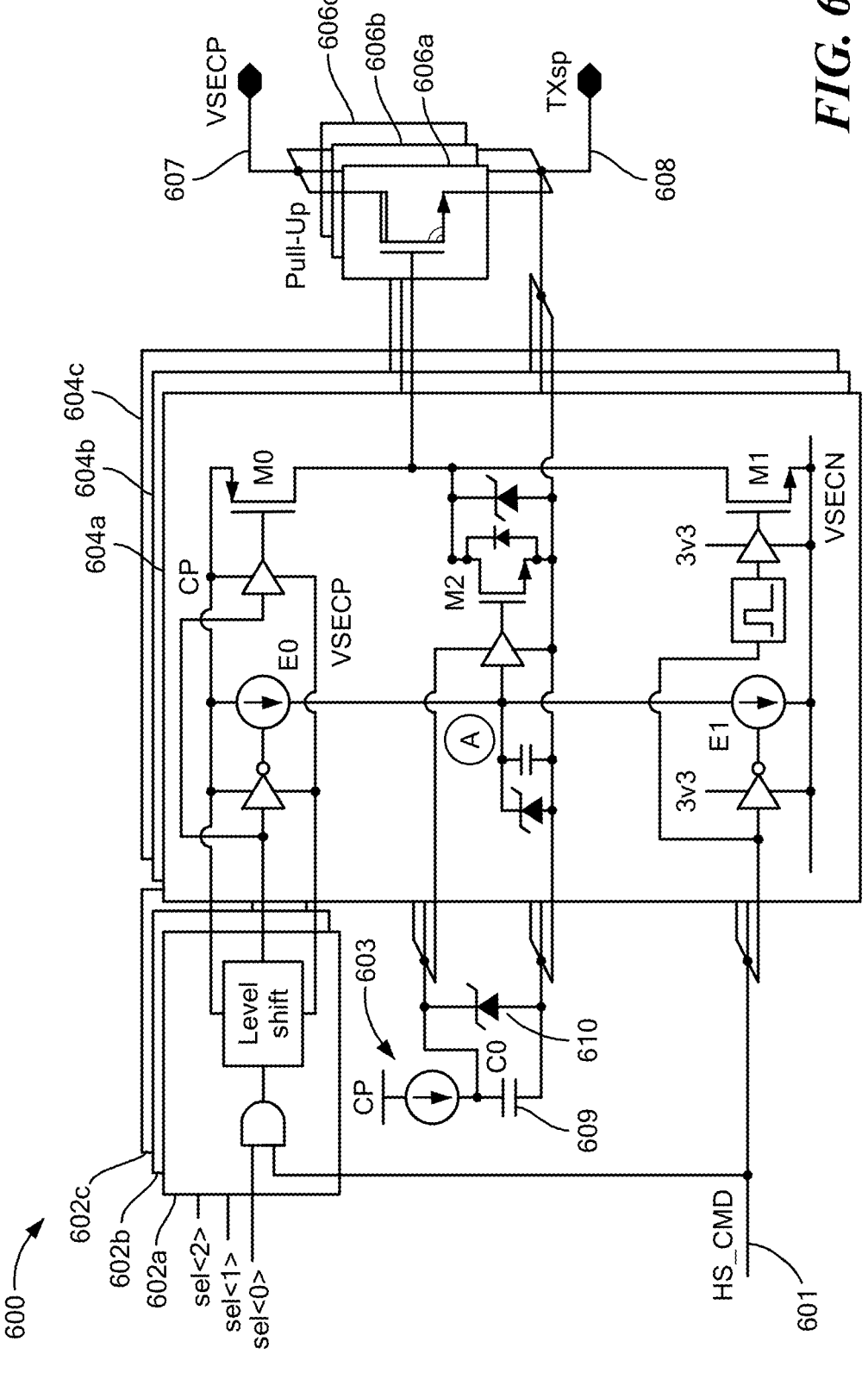
FIG. 6 is circuit diagram showing basic structure of an example segmented high-side driver in accordance with the present disclosure.

FIG. 6 is circuit diagram showing basic structure of an example segmented high-side driver 600 in accordance with the present disclosure. For each of multiple high-side power transistors, segmented high-side driver 600 can generally include a three-section circuit 604a-604c, each with an individual pull-up section 611a-611c, e.g., similar to section 311 of FIG. 3, an individual first pull-down section 621a-621c, e.g., similar to section 321 of FIG. 3, and an individual second pull-down (a.k.a., Miller clamp) section 631a-631c, e.g., similar to section 331 of FIG. 3. Segmented high-side driver 600 can thus provide control for multiple (which may be generally designated as, "N") high-side power (switching) transistors, as indicated by 606a-606c. Segmented high-side driver 600 can provide a power rail 607 as an output and a transmission signal 608 and an output as shown.

As shown for segmented N-channel high-side driver 600, some portions of the HS driver 600 can be shared for all segments attached to the same "TXs" node. Such shared circuit portions may include the C0 capacitor 609, the Zener diode 610 located in parallel to the C0 capacitor 609, a main level-shifter (not shown) and some circuitry used to implement the first and second current sources (generators) E0 and E1. While a main level-shifter may be shared, extra level-shifters may be utilized (in some embodiments) to select which portions of the whole segmented power driver 600 are to be turned on.

FIG. 7 is a diagram showing an example method 700 of operating a high side gate driver for controlling one or more high side transistors, in accordance with the present disclosure. Method 700 can include, with an input, receiving command signal pulses for operation of the one or more HS power transistors, as described at 702. With one or more charge pump circuits, storing charge for operation of the one or more HS power transistors, respectively, as described at 704. With one or more pull-up sections configured to pull up a gate voltage on the one or more HS power transistors, respectively, turning the one or more HS power transistors on according to the command signals, wherein the one or more pull-up sections are configured to rectify the command signal pulses and receive charge from the one or more charge pump circuits and provide power to the one or more HS power transistors, as described at 706.

Method 700 can further include, with one or more first pull-down sections configured to provide an initial current to initiate turning off the one or more high-side (HS) power transistors, respectively, providing the initial current to place the one or more HS power transistors in an off state according to the command signal pulses, as described at 708. With one or more second pull-down sections including a Miller clamp circuit, maintaining the one or more HS power transistors in the off state, respectively, according to the command signal pulses, as described at 710. In some embodiments, the one or more HS power transistors may include one or more NMOS transistors (e.g., N-channel enhancement type devices), as described at 712.

Accordingly, embodiments and/or examples of the inventive subject matter can provide various benefits relative to prior art techniques. For example, embodiments and examples of the present disclosure can enable or facilitate control of high-side power transistors without use of bootstrap circuits with commensurate connections/pins. For further example, gate drivers (and related circuitry) according to the present disclosure may employ only a single level-shifter (as opposed to multiple). Another benefit provided is that floating supply is only used to turn on the Miller clamp switch once the HS power is already turned off. This means that the amount of current that the floating supply has to provide to turn on the Miller clamp switch (M2) is greatly reduced, which means that smaller capacitor ($C_0$) values can be used, e.g., a capacitor value ~15 pF was successfully used for an implemented embodiment. Additionally, the timing of the operation of the drive circuits can be accurately controlled to avoid any cross-conduction and to optimize the turn-on and turn-off times for HS power (switching) transistor.

Various embodiments of the concepts, systems, devices, structures, and techniques sought to be protected are described above with reference to the related drawings. Alternative embodiments can be devised without departing from the scope of the concepts, systems, devices, structures, and techniques described. Moreover, while certain circuitry components and structures have been shown and described, circuitry components and/or structures can be added and/or omitted in other embodiments/examples in accordance with the present disclosure.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, which includes a list of elements is not necessarily limited to only those elements but can include other elements not expressly listed or inherent to such apparatus, method, composition, mixture, or article.

Additionally, the term "exemplary" means "serving as an example, instance, or illustration." Any embodiment or design described as "exemplary" is not necessarily to be construed as preferred or advantageous over other embodiments or designs. The terms "one or more" and "at least one" may indicate any integer number greater than or equal to one, i.e., one, two, three, four, etc.; those terms, however, may refer to fractional numbers/values where context admits, e.g., a number of loops in a transformer coil may be a plurality that includes a fractional value, e.g., 1.6, 2.75, 3.5, 4.25, etc. The term "plurality" may indicate any integer number greater than or equal to two, i.e., two, three, four, etc.; that term, however, may refer to fractional numbers/ values greater than one, e.g., 1.2, 1.8, 2.66, etc., where context admits. The term "connection" can include an indirect connection and/or a direct connection.

References in the specification to "embodiments," "one embodiment, "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases do not necessarily refer to the same embodiment. Further, when a particular feature, structure, or characteristic is described in connection with an embodiment, it may affect such feature, structure, or characteristic in other embodiments whether explicitly described or not.

Relative or positional terms including, but not limited to, the terms "upper," "lower," "right," "left," "vertical," "horizontal, "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed but are used merely as labels to distinguish one claim element having a certain name from another element having a same name (but for use of the ordinal term) to distinguish the claim elements.

The terms "approximately" and "about" may be used to mean within ±20% of a target (or nominal) value in some embodiments, within plus or minus (±) 10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and implemented in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions as far as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

What is claimed is:

1. A gate driver configured to drive a high-side power transistor without an external bootstrap capacitor, the gate driver comprising:
   an input configured to receive command signal pulses for operation of the high-side power transistor;
   a charge pump circuit configured as a high-voltage supply rail;
   a pull-up section configured to pull up a gate voltage on the high-side power transistor to turn the high-side power transistor on according to the command signal pulses, wherein the pull-up section is connected to the high-voltage supply rail, and wherein the pull-up section is configured to rectify the command signal pulses and provide power to the high-side power transistor;
   a first pull-down section configured to provide an initial current to initiate turning off the high-side power transistor to place the high-side power transistor in an off state according to the command signal pulses; and
   a second pull-down section including a Miller clamp circuit configured to maintain an off state of the high-side power transistor according to the command signal pulses.

2. The gate driver of claim 1, wherein the high-side power transistor comprises an NMOS transistor.

3. The gate driver of claim 1, wherein the pull-up section includes a first current source (E0) and a first switch (M0);
   wherein the first pull-down section includes a second current source (E1) and a second switch (M1); and
   wherein the second pull-down section includes a charge pump input configured to receive charge from the charge pump circuit, wherein the second pull-down section includes a control node (A) connected to the first and second current sources, wherein the second pull-down section includes a third switch (M2) connected to the control node, wherein the second pull-down section includes a Zener diode connected to the third switch (M2) and configured to limit a maximum $V_{GS}$ voltage of the high-side power transistor during a turn-on phase, and wherein the third switch is configured as a Miller clamp for the high-side power transistor;
   wherein the first current source (E0) and second current source (E1) are configured to control operation of the Miller clamp; and
   wherein the first and second switches (M0, M1) are configured to control a gate-source voltage ($V_{GS}$) of the high-side power transistor.

4. The gate driver of claim 3, wherein the pull-up section includes a level shifter and a power rail receiving charge from the charge pump circuit.

5. The gate driver of claim 3, further comprising third and fourth switches configured in parallel with E0 and E1, respectively, to provide a current pulse when the first current source (E0) or second current source (E1) is turned on, respectively, to facilitate an initial transient of the control node (A).

6. A partitioned gate driver configured to drive a plurality of high-side power transistors without an external bootstrap capacitor, the partitioned gate driver comprising:
   an input configured to receive command signal pulses for operation of the plurality of high-side power transistors;
   a charge pump circuit configured as a high-voltage supply rail;
   a plurality of pull-up sections configured to receive charge from the high-voltage supply rail, each configured to pull up a gate voltage on a high-side power transistor, respectively, to turn the high-side power transistor on according to the command signal pulses, wherein the pull-up section is configured to rectify the command signal pulses and provide power to the high-side power transistor;
   a plurality of first pull-down sections, each configured to provide an initial current to initiate turning off the high-side power transistor, respectively, to place the high-side power transistor in an off state according to the command signal pulses; and
   a plurality of second pull-down sections, each including a Miller clamp circuit configured to maintain the off state of the high-side power transistor, respectively, according to the command signal pulses.

7. The partitioned gate driver of claim 6, wherein the plurality of high-side power transistors comprises NMOS transistors.

8. The partitioned gate driver of claim 6, wherein each pull-up section includes a first current source (E0) and a first switch (M0);
   wherein each first pull-down section includes a second current source (E1) and a second switch (M1); and
   wherein each second pull-down section includes a charge pump input configured to receive charge from a charge pump, wherein the second pull-down section includes a control node (A) connected to the first and second current sources, a third switch (M2) connected to the control node, a Zener diode connected to the third switch (M2) and configured to limit a maximum $V_{GS}$ voltage of a respective high-side power transistor during a turn-on phase, and is configured as a Miller clamp for the respective high-side power transistor;
   wherein the first current source (E0) and second current source (E1) are configured to control operation of the Miller clamp; and wherein the first and second switches (M0, M1) are configured to control a gate-source voltage ($V_{GS}$) of the respective high-side power transistor.

9. The partitioned gate driver of claim 8, wherein the pull-up section includes a level shifter and a power rail receiving charge from the charge pump.

10. The partitioned gate driver of claim 8, further comprising third and fourth switches configured in parallel with the first and second current sources (E0 and E1), respectively, and configured to provide a current pulse when the first current source (E0) or second current source (E1) is turned on, respectively, to facilitate an initial transient of the control node (A).

11. A method of driving one or more high-side power transistors without using an external bootstrap capacitor, the method comprising:

with an input, receiving command signal pulses for operation of the one or more high-side power transistors;

with one or more pull-up sections configured to pull up a gate voltage on the one or more high-side power transistors, respectively, turning the one or more high-side power transistors on according to the command signal pulses, wherein the one or more pull-up sections are configured to rectify the command signal pulses and provide power to the one or more high-side power transistors;

with one or more first pull-down sections configured to provide an initial current to initiate turning off the one or more high-side power transistors, respectively, providing an initial current to place the one or more high-side power transistors in an off state according to the command signal pulses; and with one or more second pull down sections including a Miller clamp circuit, maintaining the one or more high-side power transistors in the off state, respectively, according to the command signal pulses.

12. The method of claim 11, wherein the one or more high-side power transistors comprises an NMOS transistor.

13. The method of claim 11, wherein each pull-up section includes a first current source (E0) and a first switch (M0);

wherein each first pull-down section includes a second current source (E1) and a second switch (M1); and wherein each second pull-down section includes a charge pump input configured to receive charge from a charge pump circuit, wherein the second pull-down section includes a control node (A) connected to the first and second current sources, wherein the second pull-down section includes a third switch (M2) connected to the control node, wherein the second pull-down stage includes a Zener diode connected to the third switch (M2) and configured to limit a maximum $V_{GS}$ voltage of a respective high-side power transistor during a turn-on phase, and wherein the third switch is configured as a Miller clamp for the respective high-side power transistor;

wherein the first current source (E0) and second current source (E1) are configured to control operation of the Miller clamp; and wherein the first and second switches (M0, M1) are configured to control a gate-source voltage ($V_{GS}$) of the respective high-side power transistor.

14. The method of claim 13, wherein each pull-up section includes a level shifter and a power rail receiving charge from the charge pump circuit.

15. The method of claim 13, further comprising providing third and fourth switches configured in parallel with the first and second current sources (E0, E1) configured to provide a current pulse when the first current source (E0) and/or second current source (E1) is turned on, respectively, to facilitate an initial transient of the control node (A).

* * * * *